(12) United States Patent
Kamiya

(10) Patent No.: US 7,979,780 B2
(45) Date of Patent: Jul. 12, 2011

(54) ERROR CORRECTION ENCODING APPARATUS AND ERROR CORRECTION ENCODING METHOD USED THEREIN

(75) Inventor: Norifumi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 1068 days.

(21) Appl. No.: 11/792,692

(22) PCT Filed: Nov. 29, 2005

(86) PCT No.: PCT/JP2005/021909
§ 371 (c)(1),
(2), (4) Date: Jun. 8, 2007

(87) PCT Pub. No.: WO2006/064659
PCT Pub. Date: Jun. 22, 2006

(65) Prior Publication Data
US 2007/0300135 A1  Dec. 27, 2007

(30) Foreign Application Priority Data

Dec. 15, 2004  (JP) ................................ 2004-362135

(51) Int. Cl.
*H03M 13/00* (2006.01)
(52) U.S. Cl. .................... 714/781; 714/755; 714/786
(58) Field of Classification Search ............. 714/781, 714/755, 786
See application file for complete search history.

(56) References Cited

U.S. PATENT DOCUMENTS

| | | | |
|---|---|---|---|
| 5,446,747 A | 8/1995 | Berrou | |
| 5,768,296 A * | 6/1998 | Langer et al. | 714/784 |
| 6,170,076 B1 * | 1/2001 | Kim | 714/786 |
| 6,895,547 B2 | 5/2005 | Eleftheriou et al. | |
| 7,155,656 B1 * | 12/2006 | Chavali | 714/762 |
| 2004/0153722 A1 * | 8/2004 | Lee | 714/6 |

FOREIGN PATENT DOCUMENTS

| | | |
|---|---|---|
| JP | 63-107319 | 5/1988 |
| JP | 2003-115768 | 4/2003 |

(Continued)

OTHER PUBLICATIONS

Gallagher, Low-Density Parity-Check Codes (Jul. 1963).

(Continued)

*Primary Examiner* — Guy J Lamarre
(74) *Attorney, Agent, or Firm* — Young & Thompson

(57) ABSTRACT

An error correction encoding apparatus wherein the apparatus structure is simple; an iterative decoding is used to achieve a decoding with a close-to-optimum precision; and a simple mathematical expression is used to perform an evaluation of the characteristic of an error floor area without using any computer experiments. In a polynomial multiplying block 1, (n−1)-th-order polynomial multiplying units (12-1 to 12-(m−1)) further divide an information bit string, which has been blocked for an error correction encoding, into (m−1) blocks having a length n and a single block having a length (n−r) (where m and n represent integers equal to or greater than two and where r represents an integer between 1 and n inclusive); receive blocks, which have the length n, of divided information bit strings; and output a series having the same length. An r-th-order polynomial dividing unit 2 receives an addition of the outputs from the respective (n−1)-th-order polynomial multiplying units (12-1 to 12-(m−1)) and also receives a block having the length (n−r), and outputs a redundant bit series having a length r.

7 Claims, 7 Drawing Sheets

FOREIGN PATENT DOCUMENTS

| | | |
|---|---|---|
| JP | 2004-72130 | 3/2004 |
| WO | 03/048918 A1 | 6/2003 |

OTHER PUBLICATIONS

Mackay, "Good Error-Correcting Codes Based on Very Sparse Matrices", IEEE Trans on Info Theory, vol. 45, No. 2, pp. 399-431 (Mar. 1999).

Richardson et al., "Efficient Encoding of Low-Density Parity-Check Codes", IEEE Trans on Info Theory, vol. 47, No. 2, pp. 638-656 (Feb. 2001).

Richardson et al., "Design of Capacity-Approaching Irregular Low-Density Parity-Check Codes", IEEE Trans on Info Theory, vol. 47, No. 2, pp. 619-637 (Feb. 2001).

Ishida et al., "A New Construction of Regular LDPC Codes," Tech Rep of IEICE, pp. 7-12 (Jul. 2002).

* cited by examiner

ERROR CORRECTION ENCODING APPARATUS AND ERROR CORRECTION ENCODING METHOD USED THEREIN

TECHNICAL FIELD

The present invention relates to an error correction encoding apparatus and an error correction encoding method used therein, and particularly to a block error correction encoding system wherein an information series is divided into blocks having a predetermined length and a redundant series is independently added to each block, a low-density parity-check (LDPC) encoding method used in a circuit therein, and an apparatus thereof.

BACKGROUND ART

Error correction encoding technologies achieving large coding gain have been introduced to satellite communications and mobile telecommunication systems in order to meet the demands regarding the system structure such as reducing required power and the size of antennas. A low-density parity-check code is known as an error correction code achieving very large coding gain, and has been used in various communication systems and storage units such as magnetic storage units.

The low density parity check code does not refer to one particular error correction encoding method, but it is a general term for error correction codes characterized by a sparse check matrix (most elements in the matrix are 0, and the number of "1" elements is very few). By selecting a sparse check matrix and using an iterative decoding method such as the sum-product algorithm, the low-density parity-check code can realize an error correction encoding system capable of achieving very large coding gain close to the theoretical limit (for instance refer to Non-Patent Documents 1 and 2).

Technical problems regarding the low-density parity-check code are as follows. The amount of calculation required for the encoding method (the method for calculating a redundant bit sequence from an information bit sequence) is large, and it is difficult to evaluate the performance of the error-rate characteristics (the obtained coding gain) in an area where the error probability is low, particularly an error floor area. In a most typical encoding apparatus in which the encoding system is constituted by matrix multiplication by a generator matrix of the code, the number of exclusive-OR operations required is proportional to the square of the code length.

Further, when an encoding apparatus is constituted by a check matrix of the code, the check matrix is transformed by means of elementary matrix transformations so that it partially forms a diagonal matrix such as an expression (1) and the apparatus is realized by the transformed check matrix.

[Expression 1]

$$\begin{bmatrix} & \begin{matrix} 1 & & & 0 \\ & 1 & & \\ & & \ddots & \\ 0 & & & 1 \end{matrix} \end{bmatrix} \quad (1)$$

More concretely, when the part indicated by A in the expression (1) is an r×k matrix (where r and k represent positive integers), and $c_1, c_2, \ldots, c_k$ is an information bit series of k bits, each bit $p_i$ (where i represents an integer between 1 and r inclusive) of a redundant bit string $p_1, p_2, \ldots, p_r$ of r bits that corresponds to the information bit series of k bits can be derived by the following expression (2):

[Expression 2]

$$p_i = \sum_{j=1}^{k} a_{i,j} c_j = a_{i,1} c_1 + a_{i,2} c_2 + \ldots + a_{i,k} c_k \quad (2)$$

Here, $a_{i,j}$ in the expression (2) represents the (i, j) element of the r×k matrix A (where i represents an integer between 1 and r inclusive, and j represents an integer between 1 and k inclusive). Therefore, in order to constitute an encoding apparatus of an error correction code, the r×k matrix A is held in a storage unit such as a memory, and exclusive-OR operations need to be performed as many times as the number of "1"s in the elements of the matrix.

FIG. 7 shows an example of a conventional encoding apparatus relating to the low-density parity-check code. 51 in FIG. 7 is a redundant bit string calculating unit that performs the expression (2), 52 in FIG. 7 is a memory that holds the matrix A in the expression (1), and 53 in FIG. 7 is a switch.

In regard to the reduction of storage units and exclusive-OR units in an encoding apparatus, a method in which the amount of memory is reduced and exclusive-OR operations are simplified by limiting the check matrix to a matrix constituted by a cyclic permutation matrix in the block-matrix form and imposing regularity on the matrix A (for instance refer to Patent Document 1), and a method for constituting low-density parity-check codes in which the number of "1"s in the elements of the matrix A is minimized whereas the coding gain obtained by iterative decoding is maximized (for instance refer to Non-Patent Document 3) are known.

Further, as error correction codes with which an encoding apparatus can easily be realized, cyclic codes in which a redundant bit string is calculated by using only a polynomial dividing circuit are known; the cyclic codes are represented by Reed Solomon (RS) code and BCH code, in particular. Further, as with the aforementioned cyclic codes, an encoding apparatus can easily be realized by using convolutional codes.

However, in the cyclic codes or the convolutional codes having a long constraint length, the amount of calculation required for soft-decision decoding that performs decoding with a close-to-optimum precision is very large, offering a problem, and sufficient coding gain cannot obtained, compared with the low-density parity-check codes in which decoding can easily be performed with a close-to-optimum precision using an iterative decoding unit utilizing the aforementioned sum-product algorithm, which is courted as a problem. As relatively simple codes that can be decoded with a close-to-optimum precision using an iterative decoding and used for an encoding apparatus, turbo codes (for instance, refer to Patent Document 2) are known, however, the turbo codes have low code rates (the ratio between the lengths of the information bit string and the code bit string), therefore they are not suitable for a system that requires a high code rate.

The fact that the evaluation of the error-rate characteristics of the low-density parity-check codes and the performance prediction of the error-rate characteristics can be generally performed by a system called "density evolution" in an area where the error probability is sufficiently high is known (for instance, refer to Non-Patent Document 4). The performance prediction of the error-rate characteristics in an area where the error probability is low, particularly in an area called error floor, is evaluated by an experimental method utilizing a computer simulation.

As described above, the conventional encoding apparatus relating to a low-density parity-check code are implemented by the storage units that hold the matrix A in the expression (1) and the operation processing units that perform the operation of the expression (2). Further, the evaluation of the error-rate characteristics is performed experimentally.

[Patent Document 1]

Japanese Patent Kokai Publication No. JP-P2003-115768A (pp. 10-11, FIGS. 4 to 7)

[Patent Document 2]

U.S. Pat. No. 5,446,747 (p. 2, FIG. 1)

[Non-Patent Document 1]

Gallager, R., "Low-Density Parity-Check Codes," MIT Press, 1963

[Non-Patent Document 2]

MacKay, D. J. C., "Good Error-Correcting Codes Based on Very Sparse Matrices," IEEE Transactions on Information Theory, Vol. 45, No. 2, March 1999, pp. 399-431

[Non-Patent Document 3]

Richardson, T. J., and Urbanke, R. L., "Efficient Encoding of Low-Density Parity-Check Codes," IEEE Transactions on Information Theory, Vol. 47, No. 2, February 2001, pp. 638-656 [Non-Patent Document 4]

Richardson, T. J., Shokrollahi, M. A. and Urbanke, R. L., "Design of Capacity-Approaching Irregular Low-Density Parity-Check Codes," IEEE Transactions on Information Theory, Vol. 47, No. 2, February 2001, pp. 619-637.

DISCLOSURE OF THE INVENTION

Problems to be Solved by the Invention

Since the conventional error correction encoding apparatus relating to the low-density parity-check code described above is implemented by the storage units that hold the matrix A in the expression (1) and the operation processing units that perform the operation of the expression (2), the size of the encoding apparatus is very large compared with the apparatuses utilizing cyclic codes such as Reed Solomon code or convolutional codes. Particularly, under circumstances in which the demands for the device size and power consumption are high such as satellite communications and mobile telecommunications, the amount of the storage units and the exclusive-OR units needs to be further reduced.

Further, while an encoding apparatus can be realized with relative ease using the turbo codes, it is difficult to apply such an apparatus to systems that require high code rates since the turbo code have low code rates. Because of the problems described above, in order to obtain large coding gain using the low-density parity-check codes, a large amount of calculation is required for encoding process, and the configuration of the apparatus become complex, particularly in communication systems in which high code rates are demanded.

Further, in the conventional error correction encoding apparatus, the evaluation of the error-rate characteristics has to be performed experimentally. The prediction of the error-rate characteristics in an area where the error probability is low, particularly in an area called "error floor", or the prediction of the error probability, in which the error floor is observed, is an important issue in evaluating the reliability of a communication system. An experimental method utilizing a computer simulation is effective, however, it is time-consuming to experimentally simulate the characteristics of an area with an error probability of $10^{-12}$ considering the capability of current computers.

Accordingly, it is an object of the present invention to solve the problems above, and provide an error correction encoding apparatus wherein the apparatus structure is simple, an iterative decoding is used to achieve decoding with a close-to-optimum precision, and a simple mathematical expression is used to perform evaluation of the characteristic of an error floor area without using any computer experiments, and an error correction encoding method used therein.

Means to Solve the Problems

An error correction encoding apparatus according to the present invention is an error correction encoding apparatus that uses a low-density parity-check code and comprises (m−1) polynomial multiplying units (where m represents an integer equal to or greater than two) that respectively receive a block having a length n (where n represents an integer equal to or greater than two) of an information bit string divided into the (m−1) blocks of bit strings having the length n and a single block of a bit string having a length (n−r) (where r represents an integer between 1 and n inclusive), perform polynomial multiplication, and respectively output a bit series having the length n; an adder unit that adds each output of the (m−1) polynomial multiplying units; and a polynomial dividing unit that performs polynomial division of an output result of the adder unit and the block having the length (n−r) and outputs a redundant bit series having a length r.

An error correction encoding method according to the present invention is an error correction encoding method in which a low-density parity-check code is used; (m−1) polynomial multiplying units (where m represents an integer equal to or greater than two) respectively receive a block having a length n (where n represents an integer equal to or greater than two) of an information bit string divided into the (m−1) blocks of bit strings having the length n and a single block of a bit string having a length (n−r) (where r represents an integer between 1 and n inclusive), perform polynomial multiplication, and respectively output a bit series having the length n; an adder unit adds each output of the (m−1) polynomial multiplying units; and a polynomial dividing unit performs polynomial division of an output result of the adder unit and the block having the length (n−r) and outputs a redundant bit series having a length r.

In other words, in order to achieve the object described above, the error correction encoding apparatus according to the present invention comprises (m−1) polynomial multiplying units that further divide an information bit string having a length K (where K represents an integer), which has been blocked for an error correction encoding, into (m−1) blocks having a length n and a single block having a length (n−r) (where m and n represent integers equal to or greater than two and r represents an integer between 1 and n inclusive), receive (m−1) blocks, which have the length n, among divided information bit strings, perform polynomial multiplication, and output a series having the length n; an adder unit that adds each output of the (m−1) polynomial multiplying units; and a polynomial dividing unit that receives an output result of the adder unit and the block having the length (n−r), performs polynomial division, and outputs a redundant bit series having a length r.

By having the configuration described above, the error correction encoding apparatus of the present invention can be realized with a simple apparatus structure since it is formed of polynomial multiplying units and a polynomial dividing unit, and the amount of calculation required for encoding processing and the apparatus scale can be reduced. Further, the number of codewords with minimum weight in the error correction encoding apparatus of the present invention can be made small by the selection of the wiring connection in the polynomial multiplying units and wiring connection in the polynomial dividing unit.

Therefore, in the error correction encoding apparatus of the present invention, the apparatus scale is small, the apparatus structure is simple, and a large coding gain can be obtained using an iterative decoding method, contributing to improvement in the reliability and a reduction of the required power in communication systems.

Further, since accurate approximations of the minimum distance and the number of codewords with the minimum weight are made possible by the way selections are made for the wiring connection in the polynomial multiplying units and the polynomial dividing unit in the error correction encoding apparatus of the present invention, it is possible to easily calculate good approximations of the error-rate characteristics, particularly the error probability in an error floor area, in a typical communication system to which the present invention is applied. Therefore, it becomes possible to quantitatively evaluate the reliability of the communication system even when it is too time-consuming to perform an experimental evaluation using a computer simulation or when the amount of calculation is too much to do so.

Meritorious Effects of the Invention

In the present invention, by having the configuration and operation described below, the apparatus structure can be made simple, decoding with a close-to-optimum precision can be achieved using an iterative decoding, and evaluation of the characteristic of an error floor area can be performed using a simple mathematical expression without using any computer experiments.

EXPLANATIONS OF SYMBOLS

Figure 1:
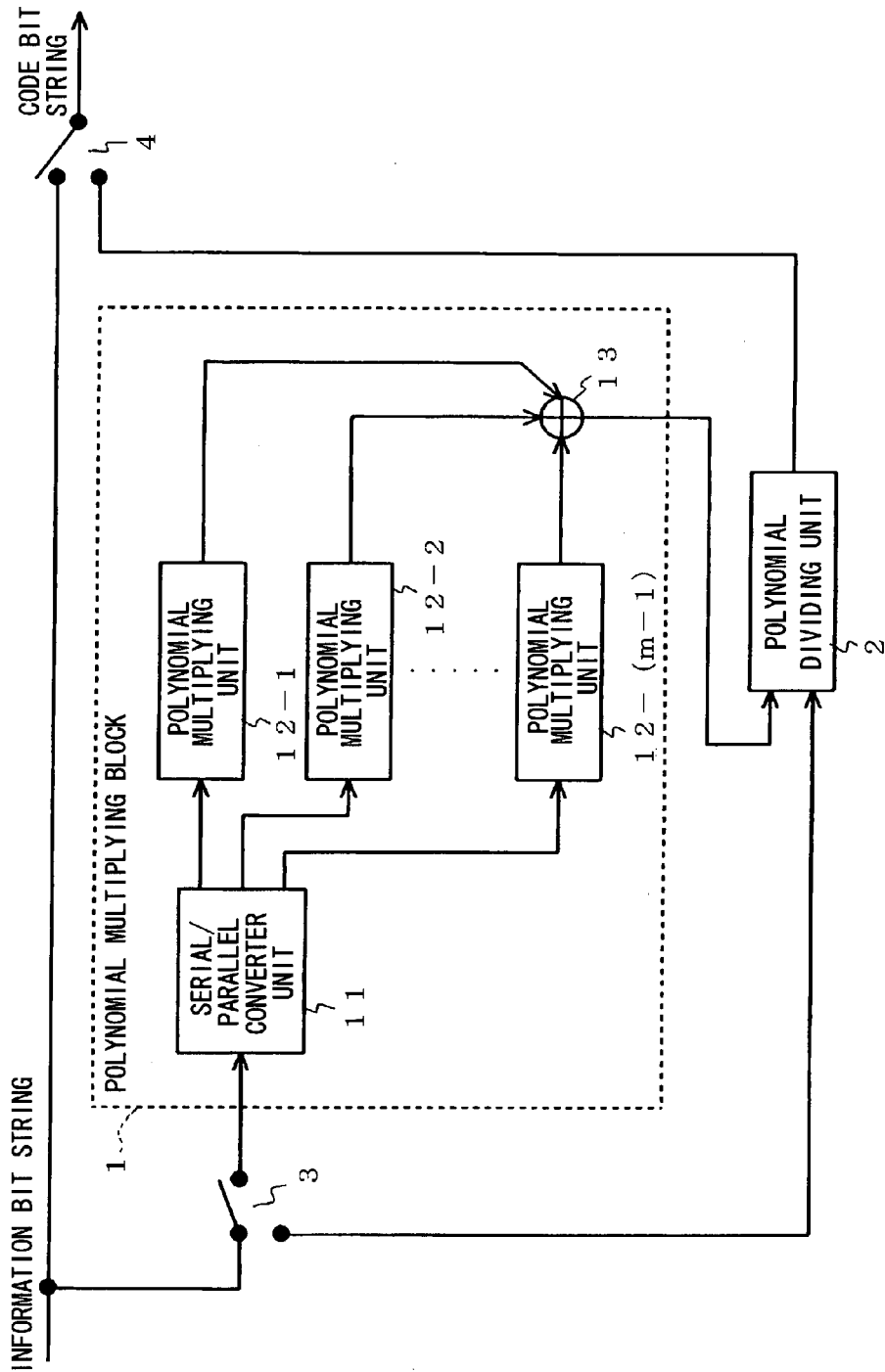
FIG. 1 is a block diagram showing the configuration of an error correction encoding apparatus according to an example of the present invention.

1: polynomial multiplying block
2: r-th-order polynomial dividing unit
3, 4, 24, 34, 124: switch
11, 40: serial/parallel converter unit
12, 12-1 to 12-(m−1): (n−1)-th-order polynomial multiplying unit
13: adder unit
21-1 to 21-r, 31-1 to 31-n, 121-1 to 121-n: register
22-1 to 22-r, 32-1 to 32-n, 122-1 to 122-n: exclusive-OR unit
23-1 to 23-(r−1), 33, 123-1 to 123-n: switch indicating a wired or unwired state

PREFERRED MODES FOR CARRYING OUT THE INVENTION

Next, examples of the present invention will be described with reference to the drawings. FIG. 1 is a block diagram showing the configuration of an error correction encoding apparatus according to an example of the present invention. In FIG. 1, the error correction encoding apparatus according to an example of the present invention is formed by a polynomial multiplying block 1 comprising a serial/parallel (S/P) converter unit 11, an m−1 number of (n−1)-th-order polynomial multiplying units 12-1 to 12-(m−1), and an adder unit 13, a r-th-order polynomial dividing unit 2, and switches 3 and 4, and is an apparatus that converts an information bit string of (nm-r) bits into a code bit string of nm bits (where m and n represent integers equal to or greater than two and r represents an integer from 1 to n, inclusive).

Figure 4:
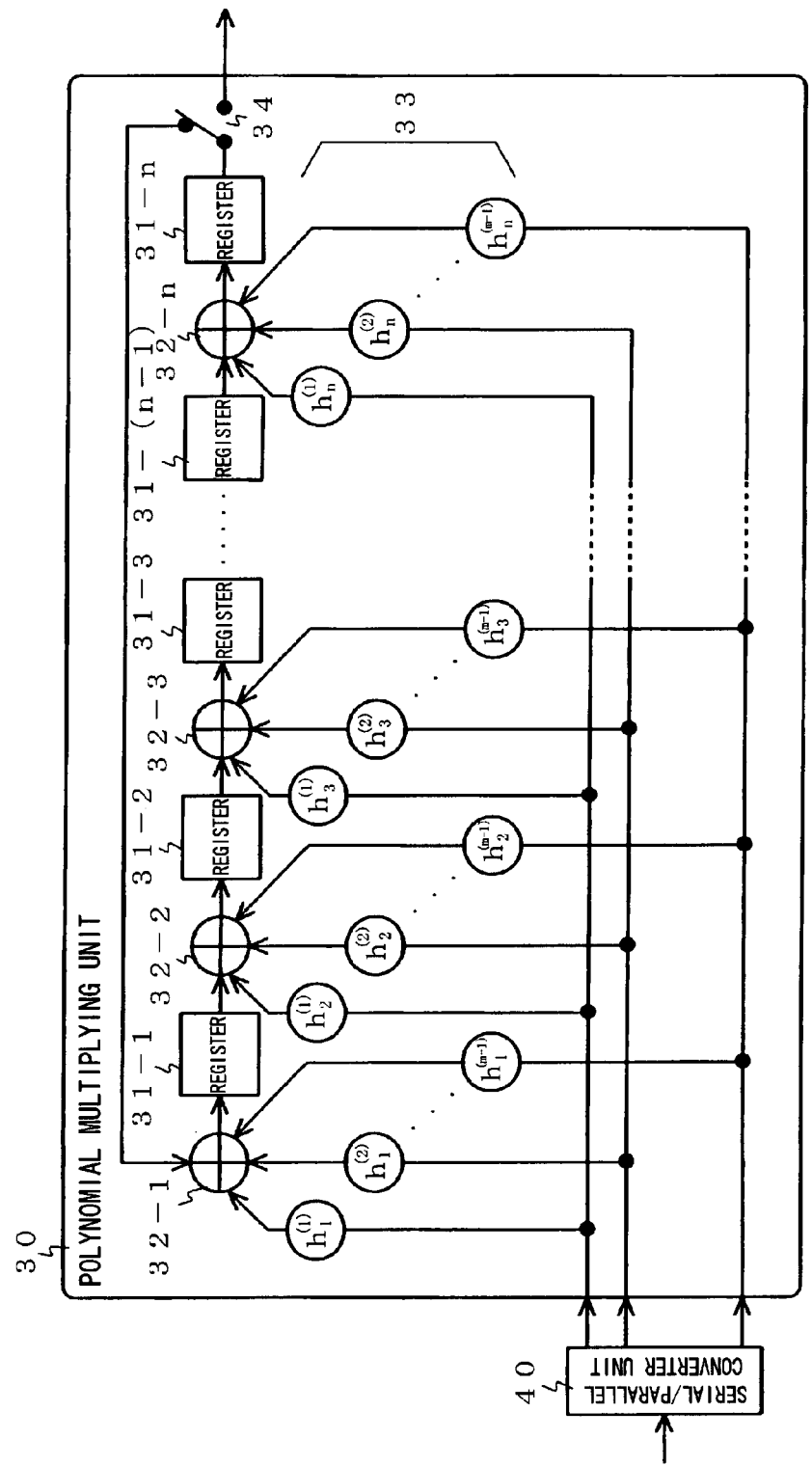
FIG. 4 is a block diagram showing the detailed configuration of a polynomial multiplying block 1 shown in FIG. 1.

As described later, the polynomial multiplying block 1 is configured as shown in FIG. 4, however, in order to simplify the explanation, we will assume that the polynomial multiplying block 1 is constituted by an m−1 number of (n−1)-th-order polynomial multiplying units 12-1 to 12-(m−1).

An encoding method (or system) of the present invention is represented as a systematic encoding scheme in which (nm-r) bits from the first bit of the code bit string coincide with the information bit string while the remaining r bits become a redundant bit string for error correction.

The (m−1) (n−1)-th-order polynomial multiplying units 12-1 to 12-(m−1) further divide an information bit string having a length K (where K represents an integer), which has been blocked for an error correction encoding, into (m−1) blocks having a length n and a single block having a length (n−r) (where m and n represent integers equal to or greater than two and where r represents an integer from 1 to n inclusive), receive each of (m−1) blocks having the length n of (among) the divided information bit strings, performs (n−1)-th-order polynomial multiplication, and each output a series, (or sequence) each having the length n.

The adder unit 13 adds up each output of the (m−1) (n−1)-th-order polynomial multiplying units 12-1 to 12-(m−1). The r-th-order polynomial dividing unit 2 receives the block having the length (n−r) and an output result of the adder unit 13, performs r-th-order polynomial division, and outputs a redundant bit series having a length r.

Figure 2:
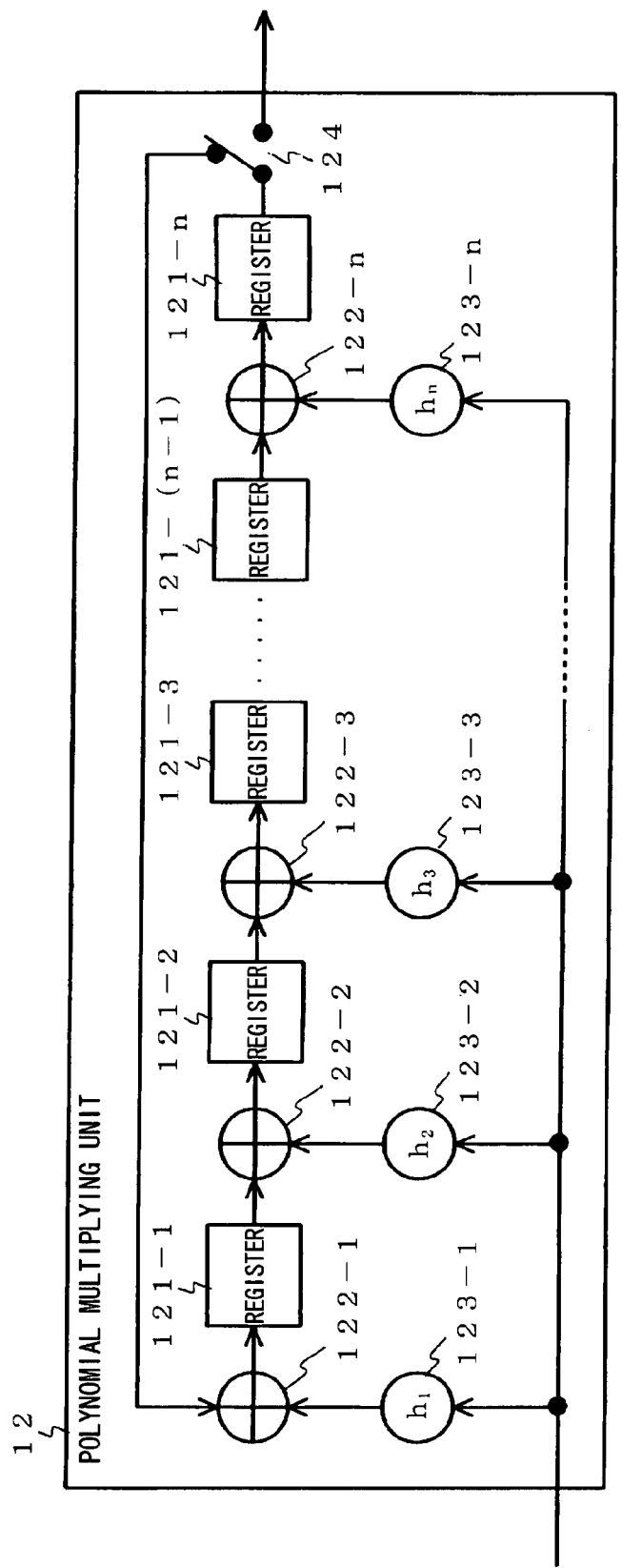
FIG. 2 is a block diagram showing the configuration of an (n−1)-th-order polynomial multiplying unit shown in FIG. 1.

FIG. 2 is a block diagram showing the configuration of the (n−1)-th-order polynomial multiplying unit. In FIG. 2, the (n−1)-th-order polynomial multiplying unit 12 is constituted by an n number of registers 121-1 to 121-n and, an n number, at a maximum, of exclusive-OR units 122-1 to 122-n. The (n−1)-th-order polynomial multiplying units 12-1 to 12-(m−1) in FIG. 1 are all configured identically to this (n−1)-th-order polynomial multiplying unit 12.

The (n−1)-th-order polynomial multiplying unit 12 receives/outputs n bits, and sequentially receives an input bit string of n bits. After it has received all the bits, a switch 124 is switched over and the contents of the n registers 121-1 to 121-n are sequentially outputted.

In FIG. 2, 123-1 to 123-n are switches that are wire-connected or wire-disconnected by a predetermined bit string of n bits ($h_1, h_2, \ldots, h_n$). When $h_j$ is 1, a part marked $h_j$ is wire-connected, and when $h_j$ is 0, the part marked $h_j$ is wire-disconnected (j is an integer from 1 to m inclusive). How this bit string of n bits ($h_1, h_2, \ldots, h_n$) is selected will be described later.

Figure 3:
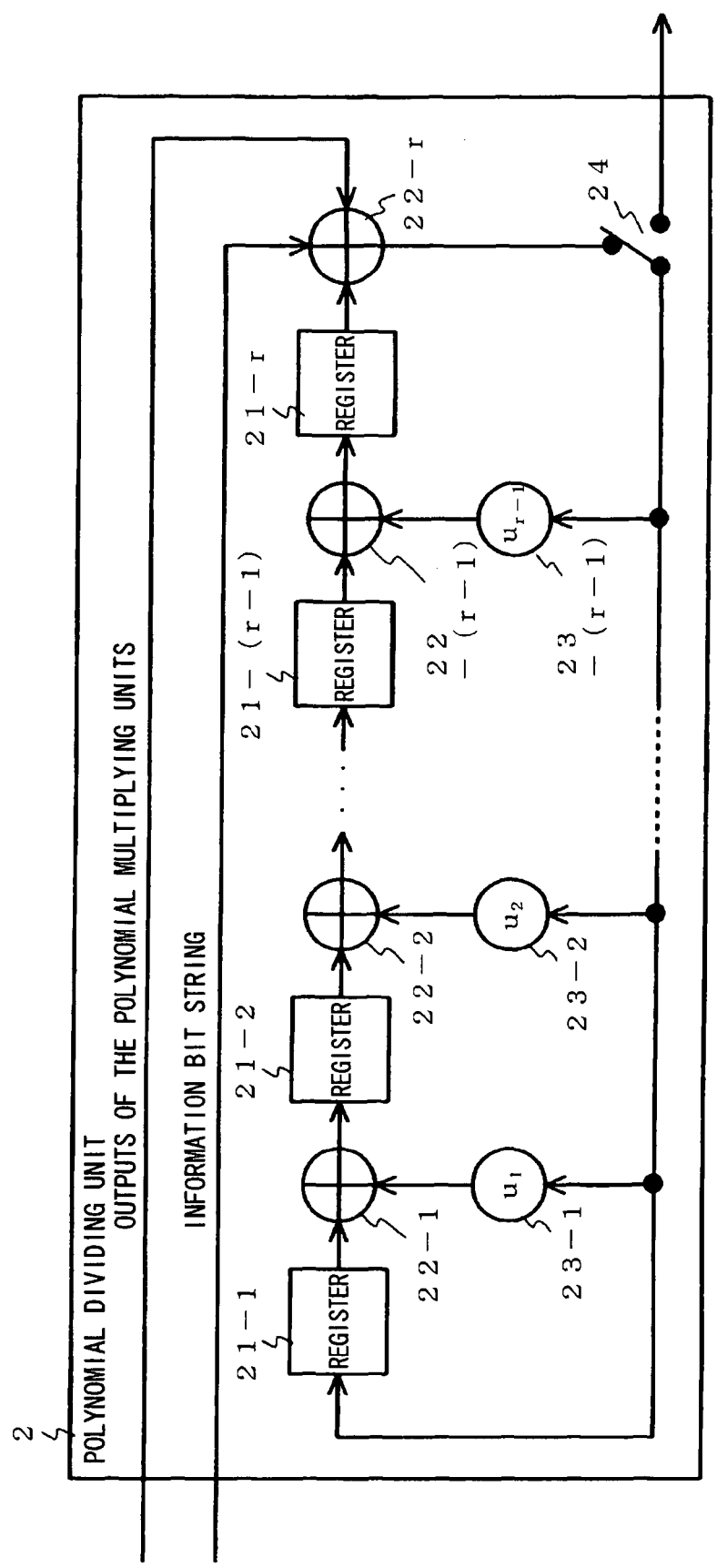
FIG. 3 is a block diagram showing the configuration of an r-th-order polynomial dividing unit shown in FIG. 1.

FIG. 3 is a block diagram showing the configuration of the r-th-order polynomial dividing unit shown in FIG. 1. In FIG. 3, the r-th-order polynomial dividing unit 2 is constituted by an r number of registers 21-1 to 21-r, an r number, at a maximum, of exclusive-OR units 22-1 to 22-r, and a switch 24.

The r-th-order polynomial dividing unit 2 receives the resultant n bits of exclusive-OR operations between (n−r) information bits and each output bit of the (m−1) (n−1)-th-order polynomial multiplying units 121-1 to 121-n, and outputs r bits. After it has received the (n−r) information bits, the r-th-order polynomial dividing unit 2 switches-over a switch 24 and sequentially outputs the results of exclusive-OR operations between the remaining r bits of each output of the (n−1)-th-order polynomial multiplying units 121-1 to 121-(m−1) and the contents of the r registers 21-1 to 21-r in FIG. 3 (at this time, the input of the information bit string is set to 0).

The output r bits of the r-th-order polynomial dividing unit 2 become the redundant bit string of r bits for the information bit string of (nm−r) bits. In FIG. 3, 23-1 to 23-(r−1) are switches that are wire-connected or disconnected by a predetermined bit string of (r−1) bits ($u_1, u_2, \ldots, u_{r-1}$). When $u_j$ is 1, a part marked $u_j$ is wire-connected, and when $u_j$ is 0, the part marked $u_j$ is disconnected (j is an integer from 1 to (r−1), inclusive). How this bit string of (r−1) bits ($u_1, u_2, \ldots, u_{r-1}$) is selected will be described later.

FIG. 4 is a block diagram showing the detailed configuration of the polynomial multiplying block 1 shown in FIG. 1. In FIG. 4, registers are shared. 33 in FIG. 4 represents a switch that is connected or disconnected by a predetermined bit string of n(m−1) bits. When the same method is applied to selection of this bit string of n(m−1) bits and the bit string that determines the wire-connection state of the switches in the (n−1)-th-order polynomial multiplying units 12 in FIG. 2, the relationship between an input and an output shown in FIG. 4 coincides with the relationship between the input and the output of the polynomial multiplying block 1 realized by using a (m−1) number of (n−1)-th-order polynomial multiplying units 12 in FIG. 2.

A check matrix that corresponds to the error correction encoding apparatus according to an example of the present invention shown in FIG. 1 is indicated in the following expression:

[Expression 3]

$$H=(H_1|H_2|\ldots|H_m) \quad (3)$$

The check matrix in the expression (3) is a linear arrangement of an m number of n×n cyclic matrices, and Hi in the expression (3) indicates the n×n cyclic matrix (where i is an integer from 1 to m, inclusive). The cyclic matrix is expressed as follows.

[Expression 4]

$$H_i = \begin{bmatrix} f_1^{(i)} & f_2^{(i)} & \cdots & f_n^{(i)} \\ f_2^{(i)} & f_3^{(i)} & \cdots & f_1^{(i)} \\ \vdots & \vdots & \ddots & \vdots \\ f_n^{(i)} & f_1^{(i)} & \cdots & f_{n-1}^{(i)} \end{bmatrix} \quad (4)$$

In the expression (4), the positions of the first row vectors are shifted by one bit to the left in the second row, and the positions of the first row vectors are shifted by (k−1) bits to the left in a k-th row thereafter (where k represents an integer from two to n, inclusive).

The first row vectors of the n×n cyclic matrix in the expression (4) is expressed by the following expression:

[Expression 5]

$$f^{(i)}(x) = f_1^{(i)} + f_2^{(i)}x + \ldots + f_n^{(i)}x^{n-1} = \sum_{j=1}^{n} f_j^{(i)} x^{j-1} \quad (5)$$

In the expression (5), the first row vectors of the n×n cyclic matrix are expressed by a polynomial of an order of (n−1) or less as $f^{(i)}$ (x) (where i is an integer from 1 to m, inclusive).

The selection of the n bit string that determines the wiring-connection between the (n−1)-th-order polynomial multiplying units 12: 12-1 to 12-(m−1) and the r-th-order polynomial dividing unit 2 is determined by the selection of m polynomials of an order of (n−1) or less: $f^{(1)}$ (x), $f^{(2)}$ (x), ..., $f^{(m)}$ (x). First, a method for selecting the m polynomials of the order of (n−1) or less: $f^{(1)}$ (x), $f^{(2)}$ (x), ..., $f^{(m)}$ will be described.

Regarding the polynomial f(x) of the order of (n−1) or less, a set s (f(x)) is defined by the following expression:

[Expression 6]

$$s(f(x))=\{i|f_{i+1}\neq 0, 0\leq i<n\} \quad (6)$$

Here, the coefficient of the term of the order i of f (x) is indicated as $f_{i+1}$. The set s(f(x)) is a subset of n integers from 0 to (n−1), inclusive, determined by the polynomial f(x).

Further, for integers v from 1 to (n−1), inclusive, a subset $\lambda_v(f(x))$ of a Cartesian product s(f(x))×s(f(x)) is defined by the following expression:

[Expression 7]

$$\lambda_v(f(x))=\{(i,j)|i-j\equiv v \bmod n, i\in s(f(x)), j\in s(f(x))\} \quad (7)$$

One of the conditions for selecting the m polynomials of the orders not more than (n−1): $f^{(1)}$ (x), $f^{(2)}$ (x), ..., $f^{(m)}$ (x) is that the m polynomials satisfy the following expression for all the integers v between 1 and (n−1) inclusive:

[Expression 8]

$$|\lambda_v(f^{(1)}(x))| + |\lambda_v(f^{(2)}(x))| + \ldots + |\lambda_v(f^{(m)}(x))| = \sum_{j=1}^{m} |\lambda_v(f^{(i)}(x))| \leq 1 \quad (8)$$

Here, the number of elements in a set A will be indicated as |A|. A second condition for selecting the m polynomials of the orders not more than (n−1): $f^{(1)}$ (x), $f^{(2)}$ (x), ..., $f^{(m)}$ (x) is that each of (m−1) polynomials $f^{(2)}$ (x), ..., $f^{(m)}$ (x) is divisible by the polynomial $f^{(1)}$ (x) with the polynomial ($x^n$−1) as a divisor. Further, these (m−1) number of quotient polynomials are expressed as $g^{(2)}$ (x), $g^{(3)}$ (x), ... $g^{(m)}$ (x) as indicated by the following expression:

[Expression 9]

$$f^{(i)}(x)=g^{(i)}(x)f^{(1)}(x) \bmod (x^n-1), i=2,3,4,\ldots,m \quad (9)$$

The first condition [the expression (8)] for selecting the m polynomials of the orders not more than (n−1): $f^{(1)}$ (x), $f^{(2)}$(x), ..., $f^{(m)}$ (x) is a necessary condition in order to achieve a decoding with a close-to-optimum precision using an iterative decoding of the low-density parity-check code, typically, the sum-product algorithm etc. As a matter of fact, by satisfying this condition [the expression (8)], a maximum number of 1s included in each row vector of the check matrix shown in the expression (3) becomes $(nm)^{1/2}$, and the check matrix becomes a sparse matrix.

The second condition [the expression (9)] is a necessary condition in order to have the error correction encoding apparatus shown in FIG. 1 accurately calculate a redundant bit string. Examples of polynomials that satisfy the both conditions [the expressions (8) and (9)] will be described later.

Next, the wiring connection in the (n−1)-th-order polynomial multiplying unit 12 shown in FIG. 2 will be described. As mentioned above, the wiring connection of the switches 123-1 to 123-*n* in the (n−1)-th-order polynomial multiplying unit 12 in FIG. 2 is determined by a predetermined bit string of n bits $(h_1, h_2, \ldots, h_n)$. When $h_j$ is 1, a part marked $h_j$ is connected, and when $h_j$ is 0, the part marked $h_j$ is disconnected (j is an integer between 1 and m inclusive).

This bit string of n bits $(h_1, h_2, \ldots, h_n)$ is selected as follows. As mentioned earlier, the error correction encoding apparatus comprises an (m−1) number of (n−1)-th-order polynomial multiplying units 12-1 to 12-(*m*−1), and an n bit string that determines the wiring connection in the i-th (n−1)-th-order polynomial multiplying units 12-*i* is expressed as follows.

[Expression 10]

$$h_1^{(i)}, h_2^{(i)}, \ldots, h_n^{(i)} \quad (10)$$

(where i represents an integer between 1 and (m−1) inclusive). This n bit string is defined by the following expression (11) using (m−1) polynomials $g^{(2)}(x), g^{(3)}(x), g^{(m)}(x)$ indicated in the expression (9):

[Expression 11]

$$\begin{cases} h_1^{(i)} = g_1^{(m+1-i)} \\ h_j^{(i)} = g_{n+2-j}^{(m+1-i)}, j = 2, 3, \ldots, n \end{cases} \quad (11)$$

[Expression 12]

$$g^{(k)}(x) = \sum_{j=1}^{n} g_j^{(k)} x^{j-1} = g_1^{(k)} + g_2^{(k)} x + g_3^{(k)} x^2 + \ldots + g_n^{(k)} x^{n-1} \quad (12)$$

(where k is an integer between two and m inclusive). Further, the bit string of n(m−1) bits that determines the wiring connection of the switches in FIG. 4 is similarly defined by the expression (10).

[Expression 13]

$$h_1^i, h_2^i, \ldots, h_n^i, i=1, 2, \ldots m-1 \quad (13)$$

Next, the wiring connection in the r-th-order polynomial dividing unit 2 shown in FIG. 3 will be described. The switches 23-1 to 23-(*r*−1) in FIG. 3 are wire-connected or wire-disconnected by a predetermined bit string of (r−1) bits $(u_1, u_2, \ldots, u_{r-1})$. When $u_j$ is 1, a part marked $u_j$ is connected, and when $u_j$ is 0, the part marked $u_j$ is disconnected (j is an integer between 1 and (r−1) inclusive). The bit string of (r−1) bits $(u_1, u_2, \ldots, u_{r-1})$ is defined by the following expression using the aforementioned polynomial $f^{(1)}(x)$:

[Expression 14]

$$1+u_{r-1}x+u_{r-2}x^2+\ldots+u_1x^{r-1}+x^r=(x^n-1)/gcd(f^{(1)}(x), x^n-1) \quad (14)$$

Here, $gcd(f^{(1)}(x), x^n-1)$ represents the greatest common polynomial of $f^{(1)}(x)$ and $(x^n-1)$, and the order of this greatest common polynomial is (n−r). As mentioned earlier, r is the redundant bit number of the encoding apparatus of the present invention. In other words, the information bit number of the error correction encoding apparatus of the present invention is the bit number obtained by, adding the order number of the greatest common polynomial of $f^{(1)}(x)$ and $(x^n-1)$ to n(m−1).

Next, the operation of the present example will be described. The error correction encoding apparatus shown in FIG. 1 sequentially receives the information bit string having the length K=(nm−r) bit (where m and n represent integers equal to or greater than two, and r represents an integer between 1 and n inclusive), which has been blocked for an error correction encoding. The information bit series is divided into a first block including the first bit to an n(m−1)-th bit and a second block including an (n(m−1)+1)-th bit to an (nm−r)-th bit.

The polynomial multiplying block 1 constituted by the (m−1) (n−1)-th-order polynomial multiplying units 12-1 to 12-(*m*−1) sequentially receives the first block, and after the switch 3 has been switched over, the second block is sequentially received by the r-th-order polynomial dividing unit 2. The first block having a length n(m−1) in the information bit string received by the polynomial multiplying block 1 is converted by the serial/parallel converter unit 11 into (m−1) bits, and each bit of the converted (m−1) bits is sequentially supplied to the (n−1)-th-order polynomial multiplying units 12-1 to 12-(*m*−1).

There are an (m−1) number of the (n−1)-th-order polynomial multiplying units 12-1 to 12-(*m*−1), and an i-th bit (where i represents an integer between 1 and (m−1) inclusive) of the serial/parallel converted (m−1) bits is supplied to the i-th (n−1)-th-order polynomial multiplying units 12-*i*. In other words, the first block is further divided into (m−1) blocks having the length n by the serial/parallel converter unit 11, and each of the (m−1) blocks having the length n is received by each of the (m−1) (n−1)-th-order polynomial multiplying units 12-1 to 12-(*m*−1).

Each of the (n−1)-th-order polynomial multiplying units 12-1 to 12-(*m*−1) receives the divided n bits, and their output bit number is n bit. The bitwise exclusive-OR of each output of the (m−1) (n−1)-th-order polynomial multiplying units 12-1 to 12-(*m*−1) becomes the n-bit output of the polynomial multiplying block 1.

Next, the operation of the (n−1)-th-order polynomial multiplying unit 12 shown in FIG. 2 will be described. The contents of the registers 121-1 to 121-*n* are all initialized to zero, and they sequentially receive the n-bit string bit by bit. During this time, the switch 124 is set so that there will be feedback. After all the n bits have been received, the switch 124 is switched, and the contents of the registers 121-1 to 121-*n* are sequentially outputted.

The error correction encoding apparatus shown in FIG. 1 uses the (m−1) number of (n−1)-th-order polynomial multiplying units 12. Since the exclusive-OR of each output of the (n−1)-th-order polynomial multiplying units 12-1 to 12-(*m*−1) becomes the output of the polynomial multiplying block 1, each of the registers (121-1 to 121-*n*) can be shared with the other (n−1)-th-order polynomial multiplying units 12-1 to 12-(*m*−1).

The configuration of the polynomial multiplying block 1 shown in FIG. 4 can be achieved as described above. The operation in the configuration in FIG. 4 is the same as described except for the fact that the registers 31-1 to 31-*n* are shared, and a desired output result can be obtained with this configuration shown in FIG. 4.

Next, the r-th-order polynomial dividing unit 2 shown in FIG. 3 will be described. The contents of the registers 21-1 to 21-r are all initialized to zero, and they sequentially and simultaneously receive the last half (n−r) bits of the information bit string and the n-bit output of the polynomial multiplying block 1 bit by bit. During this time, the switch 24 in FIG. 3 is set so that there will be feedback. After the (n−r)-bit information bit string has been received, the switch 24 is switched, and the exclusive-ORs of the remaining r bits of the output of the polynomial multiplying block 1 and the content of each register (21-1 to 21-r) are sequentially outputted (the input of the information bit string is set to zero at this time).

The r-bit output of the r-th-order polynomial dividing unit 2 shown in FIG. 3 becomes the redundant bit string for the information bit string of (nm-r) bits. When the redundant bit number r coincides with n, it means that the bit number of the information bit string received by the r-th-order polynomial dividing unit 2 is zero, and in this case, the r-th-order polynomial dividing unit 2 simply outputs the n-bit output of the polynomial multiplying block 1.

Next, the output switch 4 of the error correction encoding apparatus shown in FIG. 1 will be described. The information bit string of (nm-r) bits becomes an output bit string of the error correction encoding apparatus simultaneously as it is received by the polynomial multiplying block 1 or the r-th-order polynomial dividing unit 2. At this time, if necessary, the first to the n(m−1)-th bits of the information bits received by the polynomial multiplying block 1 are rearranged so that their order coincides with the bit order indicated by the check matrix shown in the expression (3) before being outputted.

After all the (nm−r) bits of the information bit string have been outputted, the switch 4 is switched over so that the output of the r-th-order polynomial dividing unit 2 is active, and the r-bit output of the r-th-order polynomial dividing unit 2 is outputted as an output of the error correction encoding apparatus. As described, the present example is a systematic encoding apparatus in which the first to the n(m−r) bits of the code bit string coincide with the information bit string, and the remaining r bits become the redundant bit string for error correction.

By having such a configuration, an error correction encoding apparatus using a low-density parity-check code with a code rate equal to or greater than (n−1)/n can be constituted by a maximum of 2n registers and 2n exclusive-OR units in the present example.

Further, as described later, an error correction encoding apparatus wherein the coding gain is large and the error-rate characteristics in an error floor area can be calculated by a simple mathematical evaluation expression (or formula) can be constituted by the configuration of the present example.

Next, a concrete example for calculating polynomials that satisfy the aforementioned conditions [the expressions (8) and (9)] will be described. Further, using this example, how a large coding gain can be obtained and how the error-rate characteristics in an error floor area can be calculated by a simple mathematical evaluation expression will be explained.

$\alpha$ is a primitive element a finite field GF($2^{2S}$) (where S is a positive integer), and R is a divisor of S, but is not 1 nor S. Further, n is represented by ($2^S+1$)($2^R-1$) and m by ($2^S-2^{S-R}$)/($2^R-1$). A polynomial $\psi^{(k)}$ (x) of an order not more than (n−1) is defined by the following expression:

[Expression 15]

$$\psi^{(k)}(x) = \sum_{j \in L(k)} x^j \quad (15)$$

(where k represents integers between 0 and ($2^S-1$)/($2^R-1$)−1 inclusive.)

Here, L(K) is a subset of integers between 0 and (n−1) inclusive, and it is defined by the following expression:

[Expression 16]

$$L(k) := \{j | Tr_{2S|S}(\alpha^{k+j(2^S-1)/(2^R-1)}) = 1, 0 \leq j < n\} \quad (16)$$

Note that $Tr_{2S|S}$ in the expression (16) represents the trace from the finite field GF($2^{2S}$) to GF($2^S$). There are m number of the polynomials $\psi^{(k)}$ (x) that do not equal zero where k represents integers between 0 and ($2^S-1$)/($2^R-1$)−1 inclusive.

Figure 5:
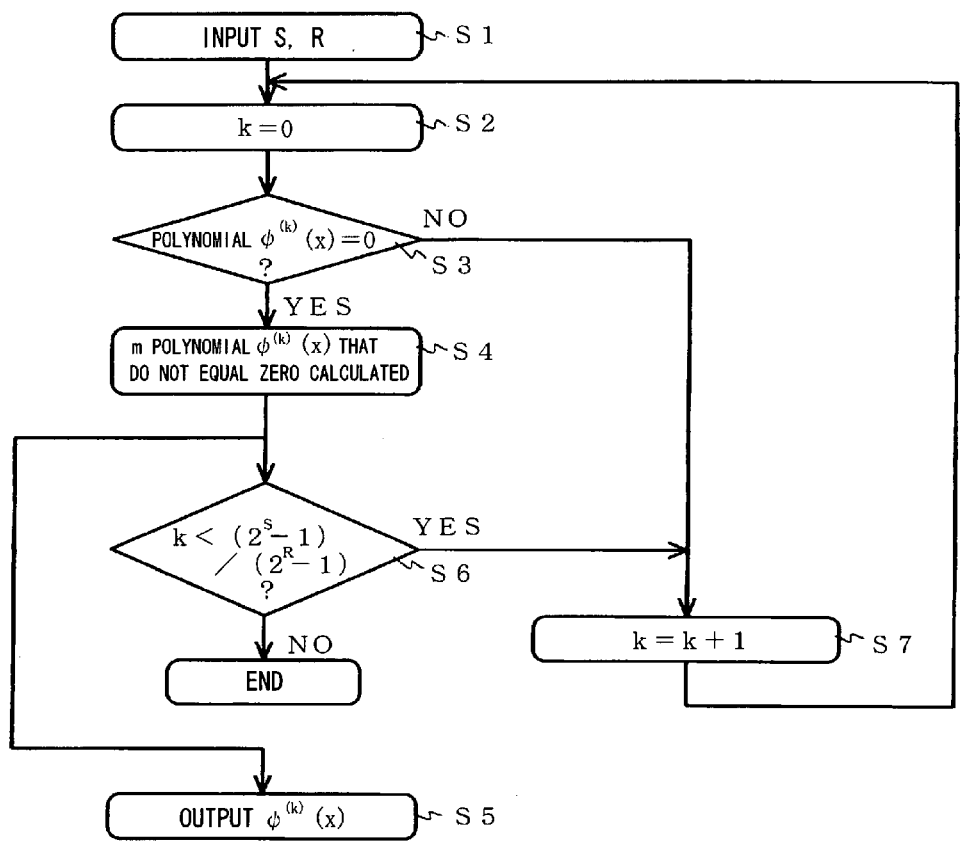
FIG. 5 is a flowchart showing an example of a method for calculating m polynomials that do not equal zero according to an example of the present invention.

FIG. 5 is a flowchart showing an example of a method for calculating the m polynomials that do not equal zero. Whether or not the polynomial $\psi^{(k)}$ (x) equals zero (where k represents integers between 0 and ($2^S-1$)/($2^R-1$)−1 inclusive) can be determined by whether or not the trace of $\alpha^{k(2S+1)}$ (where $\alpha$ is an element of a finite field GF($2^S$)) to GF($2^R$) equals zero. In other words, it can be determined by the following expression:

[Expression 17]

$$Tr_{S|R}(\alpha^{k(2^S+1)}) = 0 \quad (17)$$

Since ($2^S-1$)/($2^R-1$) multiplied by m is $2^{2S}-1$, the set L(k) in the expression (16) corresponds to a set of elements that are a subset of the finite field GF ($2^{2S}$), whose values coincide with each other when raised to the m-th power, and whose traces to the finite field GF ($2^S$) are 1. Further, even when the value of the trace above is not zero, the above expression works as long as the value of the trace is the same for each k (where k represents integers between 0 and ($2^S-1$)/($2^R-1$)−1 inclusive). Therefore, the polynomials $\psi^{(k)}$ (x) are defined by a set of elements whose values coincide with each other when raised to the m-th power, and whose traces to the finite field GF ($2^S$) are a predetermined value other than zero and coincide with each other in a subset of the finite field GF ($2^{2S}$) (steps S1 to S7 in FIG. 5).

After the m polynomials, which are the output of the flowchart in FIG. 5, are properly arranged, they are represented as $f^{(1)}$ (x), $f^{(2)}$ (x), . . . , $f^{(m)}$ (x). These m polynomials $f^{(1)}$ (x), $f^{(2)}$ (x), . . . , $f^{(m)}$ (x) satisfy the aforementioned conditions [the expressions (8) and (9)]. Here, these m polynomials should be arranged so that, particularly, the polynomial $f^{(1)}$ (x) is the minimal polynomial, which means that, among the polynomials $\psi^{(k)}$ (x) that do not equal zero, the order number of its greatest common polynomial with ($x^n-1$) is the smallest.

The length N of the code bit string in the error correction encoding apparatus according to the present example constituted by the polynomials selected as described is as follows.

$$N = nm = (2^S+1)(2^S-2^{S-R})$$

The length K of the information bit string is not less than $$n(m-1) = (2^S+1)(2^S-2^{S-R}-2^R+1)$$

To be precise, as described above, it is actually the bit number obtained by adding the order number of the greatest common polynomial of $f^{(1)}$ (x) and ($x^n-1$) to n(m−1).

Further, a minimum distance d is represented by d=$2^R+1$, and the number $A_d$ of the code bit strings with a weight d is at least ($2^S+1$)($2^S-2^{S-R}$). In reality, the number $A_d$ of the code bit strings with the weight d is very close to ($2^S+1$)($2^S-2^{S-R}$), therefore it is a good approximation. In addition, the number of the code bit strings with the weight d is very small, and this fact has a good effect on the error-rate characteristics as described later.

Using the approximations of the minimum distance d and the number of the code bit strings with the weight d, an approximate value of a bit-error probability Pb when the modulation scheme is 2PSK (2 phase-shift keying) and the channel is the additive Gaussian channel can be calculated by the following expression:

[Expression 18]

$$P_b \sim \frac{d}{N} A_d Q\left(\sqrt{2d\gamma \frac{E_b}{N_0}}\right) \quad (18)$$

Here, d represents the minimum distance ($d=2^R+1$), $A_d$ the number of the code bit strings with the weight d, N the length of the code bit string, and γ code rate (γ=K/N). Further, Eb/No represents the SNR (signal-to-noise ratio) per bit in the additive Gaussian channel, and Q represents the Gaussian Q function, which can be expressed by the following expression:

[Expression 19]

$$Q(x) = \frac{1}{\sqrt{2\pi}} \int_x^\infty \exp(-t^2/2) dt \quad (19)$$

By respectively substituting ($2^R+1$) and ($2^S+1$)($2^S-2^{S-R}$) for N and d and ($2^S+1$)($2^S-2^{S-R}$) for $A_d$ in the expression (18), the approximate value of bit-error probability $P_b$ can be calculated. This approximation is highly accurate in an error floor area, and it is effective for the evaluation of the characteristic of the error floor area when it is too time-consuming to perform an experimental evaluation using a computer simulation or when the amount of calculation is too much to do so.

Increasing the minimum distance d is effective for improving the error probability using the expression (18) and obtaining larger coding gain. There are m number of polynomials that do not equal zero among the polynomials $\psi^{(k)}$ (x) (k= 0, 1, . . . , ($2^S-1$)/($2^R-1$)−1) indicated by the expression (15). Instead of using all the m polynomials as described, it is possible to increase the minimum distance to approximately ($2^R+1$) by using only parts of the polynomials. This method will be described.

m' polynomials are selected from m polynomials $\psi^{(k)}$ (X) (where k represents integers between 0 and ($2^S-1$)/($2^R-1$)−1), inclusive that do not equal zero. After they have been properly arranged, assume that they are represented as $f^{(1)}$ (x), $f^{(2)}$ (x), . . . , $f^{(m')}$ (x). At this time, the polynomial $\psi^{(k)}$ (X) and a polynomial $\psi^{(r(k))}$ (x) should not be selected together at once. Here, r(k) represents the remainder when (2×k) is divided by ($2^S-1$)/($2^R-1$).

These m' polynomials $f^{(1)}$ (x), $f^{(2)}$ (x), . . . , $f^{(m')}$ (x) satisfy the aforementioned conditions [the expressions (8) and (9)], and the length N of the code bit string in the encoding apparatus of the present invention constituted by the polynomials selected as described is N=nm'. The minimum distance is equal to or less than $2^{R+1}$, and the number of the code bit strings with a weight $2^{R+1}$ is at least a value obtained by multiplying a binomial coefficient of m' and 2 by n. A value obtained by substituting a lower bound of the code bit strings with this weight $2^{R+1}$ into the expression (18) can provide a very good approximation of the error-rate characteristics when the error probability is relatively low (when the signal-to-noise ratio of the channel is relatively high). Using this method, the code rate becomes lower compared with the case where all the m polynomials are used, however, the error characteristics are improved, instead.

The present example will be further described using exemplified concrete values. In the present example described above, we will assume S=6 and R=3. In this case, n=455 and m=8. Further, the polynomials $\psi^{(k)}$ (X) of the expression (15) (where k represents integers between 0 and 8 inclusive) can be expressed as follows.

[Expression 20]

$$\begin{cases} \psi^{(1)}(x) = x^{131} + x^{175} + x^{201} + x^{239} + x^{254} + x^{287} + x^{288} + x^{338} \\ \psi^{(2)}(x) \equiv (\psi^{(1)}(x))^2 \bmod(x^{455} - 1) \\ \psi^{(3)}(x) = x^{30} + x^{40} + x^{121} + x^{161} + x^{190} + x^{306} + x^{315} + x^{351} \\ \quad \equiv g(x)\psi^{(1)}(x) \bmod(x^{455} - 1) \\ \psi^{(4)}(x) \equiv (\psi^{(1)}(x))^4 \bmod(x^{455} - 1) \\ \psi^{(5)}(x) \equiv x^3(\psi^{(1)}(x))^{32} \bmod(x^{455} - 1) \\ \psi^{(6)}(x) \equiv (\psi^{(3)}(x))^2 \bmod(x^{455} - 1) \\ \quad \equiv (g(x)\psi^{(1)}(x))^2 \bmod(x^{455} - 1) \\ \psi^{(7)}(x) \equiv x(\psi^{(1)}(x))^{16} \bmod(x^n - 1) \\ \psi^{(8)}(x) \equiv (\psi^{(1)}(x))^8 \bmod(x^n - 1) \end{cases} \quad (20)$$

Further, $\psi^{(0)}$ (x)=0, and g(x) represents the quotient polynomial when $\psi^{(3)}$ (x) is divided by $\psi^{(1)}$ (x) using ($x^{455}-1$) as a divisor.

When the eight polynomials $f^{(1)}$ (x), $f^{(2)}$ (x), . . . , $f^{(8)}$ (x) are represented by $f^{(k)}$ (x)=$\psi^{(k)}$ (x) (where k=1, 2, . . . , 8), these eight polynomials satisfy the aforementioned conditions [the expressions (8) and (9)]. At this time, the length N of the code bit string is 3640 bits; the length K of the information bit string is 3288 bits; the code rate r is approximately 0.9; the minimum distance is 9; and the number $A_9$ of the code bit strings with a weight 9 is equal to or more than 3640.

By substituting these values into the expression (18) and calculating the error probability, the fact that the signal-to-noise ratio per bit required for achieving a bit-error probability of $10^{-12}$ after decoding is approximately 5 decibels can be found out. This can be achieved by utilizing an iterative decoding method.

A signal-to-noise ratio necessary to achieve an even lower bit-error rate using an iterative decoding method can also easily be calculated. Further, compared with the case where this code is encoded using the Reed Solomon code with the same code rate and decoded using a typical bounded distance decoding method, a coding gain of 2.0 decibels (dB) or more can be obtained when the bit-error probability after decoding is $10^{-6}$.

When four polynomials out of the eight polynomials $\psi^{(1)}$ (x), $\psi^{(2)}$ (x), . . . , $\psi^{(8)}$ (x) are used and represented as $f^{(1)}$ (x)=$\psi^{(1)}$ (x), $f^{(2)}$ (x)=$\psi^{(4)}$ (x), $f^{(3)}$ (x)=$\psi^{(7)}$ (x), $f^{(4)}$ (x)=$\psi^{(3)}$ (x), these four polynomials satisfy the aforementioned conditions [the expressions (8) and (9)] as well. At this time, the length N of the code bit string is 1820 bits; the length K of the information bit string is 1468 bits; the code rate γ is approximately 0.8; the minimum distance is 16 or less; and the number $A_{16}$ of the code bit strings with a weight 16 is 2730 or more.

By substituting these values into the expression (18) and calculating the error probability, the fact that the signal-to-noise ratio per bit required for achieving a bit-error probability of $10^{-12}$ after decoding is approximately 4.4 decibels can be found out, and this can be achieved by utilizing an iterative decoding method. A signal-to-noise ratio necessary to achieve an even lower bit-error rate using an iterative decoding method can also easily be calculated. Further, compared with the case where this code is encoded using the Reed Solomon code with the same code rate and decoded using a typical bounded distance decoding method, a coding gain of 2.0 decibels (dB) or more can be obtained when the bit-error probability after decoding is $10^{-6}$.

Figure 6:
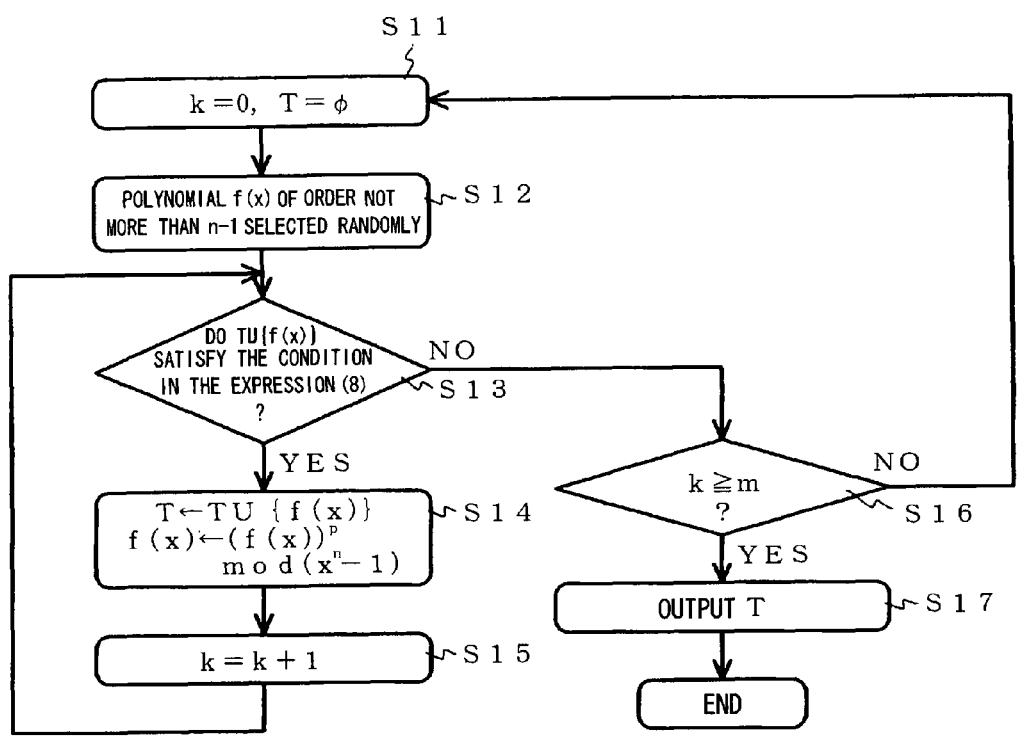
FIG. 6 is a flowchart showing an example of a method for calculating polynomials according to another example of the present invention.
Figure 7:
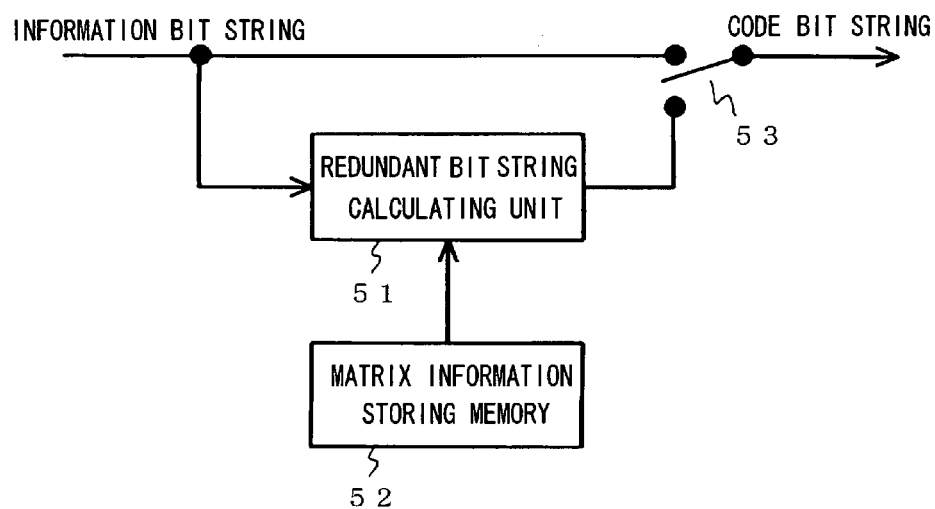
FIG. 7 is a block diagram showing an example of a conventional error correction encoding apparatus relating to the low-density parity-check code.

FIG. 6 is a flowchart showing a method for calculating polynomials according to another example of the present invention. In FIG. 6, k represents a non-negative integer, and T represents a set of polynomial(s) of order(s) not more than (n−1) (where n represents an integer equal to or greater than two). Further, p represents powers of two such as 2 and 4. In an initial state, k=0; T is an empty set; and polynomials of order(s) not more than (n−1) f(x) are selected randomly.

When these polynomials satisfy the aforementioned condition [the expression (8)] (in the expression (8), m is 1 and $f^{(1)}$ (x) is f(x)), f(x) are added to the elements of the set T, and the value of k is increased by one. In a k-th iterative processing in FIG. 6 (where k represents an integer equal to or greater than two), when the following polynomial (an expression (21)) calculated from the set of polynomials T and the polynomials f(x) described above satisfies the aforementioned condition [the expression (8)] (m in the expression (8) is k), $f^{(k)}(x)$ is added to the elements of the set T and the value of k is increased by one.

[Expression 21]

$$f^{(k)}(x) \equiv (f(x))^{p^{(k-1)}} \bmod (x^n - 1) \tag{21}$$

As soon as the number of polynomials included in the set of polynomials T reaches a predetermined number m (where m represents an integer equal to or greater than two), T is outputted and the processing ends (steps S11 to S17 in FIG. 6).

In FIG. 6, as described above, by the polynomials f(x), which are randomly selected in the initial state, the following expression can be obtained:

[Expression 22]

$$f^{(k)}(x) \equiv (f(x))^{p^{(k-1)}} \bmod (x^n - 1), k = 1, 2 \ldots, m \tag{22}$$

Then the output T of the flowchart of FIG. 6 is T={$f^{(1)}(x)$, $f^{(2)}(x)$, ..., $f^{(m)}(x)$}, and they satisfy the aforementioned conditions [the expressions (8) and (9)]. Further, when the number of terms that do not equal zero in the polynomials f(x) selected in the initial state is represented by w, each of the polynomials included in T has w terms that do not equal zero.

The length N of the code bit string in an error correction encoding apparatus according to the present example constituted by the m polynomials $f^{(1)}(x)$, $f^{(2)}(x)$, ..., $f^{(m)}(x)$, which are the output of the flowchart in FIG. 6, is N=nm, and the length K of the information bit string is at least n(m−1). To be precise, as described above, it is actually the bit number obtained by adding the order number of the greatest common polynomial of $f^{(1)}$ (x) and $(x^n-1)$ to n(m−1).

When p is 2, the minimum distance d is d=w+1 and the number $A_d$ of the code bit strings with a weight d is at least n(m−1). In most of cases, a value obtained by substituting a lower bound of the number of the code bit strings with this minimum weight into the expression (18) can provide a very good approximation of the error-rate characteristics when the error probability is relatively low (when the signal-to-noise ratio of the channel is relatively high).

Further, when p is not 2, the number of the code bit strings with a weight 2w is at least a value obtained by multiplying the binomial coefficient of m and 2 by n, and in most cases, a value obtained by substituting a lower bound of the number of the code bit strings with this minimum weight 2w into the expression (18) can provide a very good approximation of the error-rate characteristics when the error probability is relatively low (when the signal-to-noise ratio of the channel is relatively high).

Next, the present example will be further described using concrete values as an example. When n=255, m=4, and p=4 in the present example, by $f_5$ (x) expressed as below,

[Expression 23]

$$f_5(x) = x^{25} + x^{33} + x^{64} + x^{114} + x^{185} f_7(x) = x^6 + x^{114} + x^{132} + x^{168} + x^{218} + x^{230} + x^{241} \tag{23}$$

the following expression can be obtained:

[Expression 24]

$$f^{(k)}(x) \equiv (f_5(x))^{4^{(k-1)}} \bmod (x^{255} - 1), k = 1, 2, 3, 4 \tag{24}$$

Then, as an output of the processing described in FIG. 6, for instance, T={$f^{(1)}$ (x), $f^{(2)}$ (x), $f^{(3)}$ (x), $f^{(4)}$ (x)} can be obtained.

These polynomials satisfy the aforementioned conditions [the expressions (8) and (9)]. At this time, the length N of the code bit string is 1020 bits; the information bit number K is 769 bits; the code rate is approximately 0.754; the minimum distance is 10 or less; and the number $A_{10}$ of the code strings with a weight 10 is 1530 or more.

By substituting these into the expression (18) and calculating the error probability, the fact that the signal-to-noise ratio per bit required for achieving a bit-error probability of $10^{-12}$ after decoding is approximately 5.6 decibels can be found out, and this can be achieved by utilizing an iterative decoding method. A signal-to-noise ratio necessary to achieve an even lower bit-error rate using an iterative decoding method can also easily be calculated.

Next, by $f_7$ (x) in the expression (23), the following expression can be obtained:

[Expression 25]

$$f^{(k)}(x) \equiv (f_7(x))^{4^{(k-1)}} \bmod (x^{255} - 1), k = 1, 2, 3, 4 \tag{25}$$

Then, as an output of the processing shown in FIG. 6, T={$f^{(1)}$ (x), $f^{(2)}$ (x), $f^{(3)}$ (x), $f^{(4)}$ (x)} can be obtained as in the case of $f^{(5)}$ (x) described above. These polynomials satisfy the aforementioned conditions [the expressions (8) and (9)]. At this time, the length N of the code bit string, the information bit number K, and the code rate are 1020, 769, and 0.754 respectively, exactly the same as in the case of $f^{(5)}$ (x) described above, except that the minimum distance is different: 14 or less. Further, the number $A_{14}$ of the code strings with a weight 14 is 1530 or more.

By substituting these into the expression (18) and calculating the error probability, the fact that the signal-to-noise ratio per bit required for achieving a bit-error probability of $10^{-12}$ after decoding is approximately 5.0 decibels can be found out, and this can be achieved by utilizing an iterative decoding method. A signal-to-noise ratio necessary to achieve an even lower bit-error rate using an iterative decoding method can also easily be calculated.

When the bit-error probability after decoding is $10^{-12}$, compared with the apparatus constituted by $f^5$ (x) described above, an increase of 0.6 decibels in coding gain can be expected. On the other hand, when the bit-error probability after decoding is $10^{-6}$, compared with the apparatus constituted by $f^5$ (x), the coding gain decreases by 0.4 decibels. In this case, the structure of the error correction encoding apparatus should be selected according to the demands of a communication system, and by the selection of polynomials, the error correction encoding apparatus according to the present invention is capable of meeting a wide variety of demands.

INDUSTRIAL APPLICABILITY

The present invention can be applied to an error correction technology for meeting the demands regarding the system structure such as reducing required power and the size of antennas in satellite communications and mobile telecommunication systems or to an error correction technology for improving reliability of storage units such as magnetic storage units.

The invention claimed is:

1. An error correction encoding apparatus using a low-density parity-check code, said apparatus comprising:
   m−1 polynomial multiplying units where m represents an integer equal to or greater than two that respectively receive a block having a length n where n represents an integer equal to or greater than two of an information bit string divided into said m−1 blocks of bit strings having the length n and a single block of a bit string having a length n−r where r represents an integer between 1 and n inclusive, perform polynomial multiplication, and respectively output a bit series having the length n;
   an adder unit that adds each output of said m−1 polynomial multiplying units; and
   a polynomial dividing unit that performs polynomial division of an output result of said adder unit and said block having the length n−r and outputs a redundant bit series having a length r.

2. The error correction encoding apparatus as defined in claim 1, wherein said polynomial dividing unit and said polynomial multiplying units include a circuit in which registers and exclusive-OR circuits connected to outputs of said registers are connected in a cascade fashion in a plurality of stages; and output logics of said exclusive-OR circuits are set by wiring connection determined according to a predetermined polynomial operation so that output logics of said exclusive-OR circuits are non-inverted or inverted.

3. The error correction encoding apparatus as defined in claim 2, wherein a wiring polynomial that specifies the wiring connection in said polynomial dividing unit is a minimal polynomial among polynomials defined by a set of elements whose values coincide with each other when raised to the m-th power, and whose traces to a finite field of $2^S$ elements are a value other than zero and coincide with each other in a subset of a finite field of $2^{2S}$ (where S represents a positive integer) elements, and the quotient polynomial when a polynomial defined by a subset of another finite field is divided by said minimal polynomial is a wiring connection polynomial that specifies the wiring connection in said polynomial multiplying units.

4. The error correction encoding apparatus as defined in claim 2, wherein wiring polynomials that specify the wiring connection in said polynomial dividing unit are randomly selected, and each of m−1 wiring polynomials that specify the wiring connection in said m−1 polynomial multiplying units are determined by powers of said polynomials selected randomly that are different from each other.

5. An error correction encoding method using a low-density parity-check code, said method comprising;
   in m−1 polynomial multiplying units where m represents an integer equal to or greater than two respectively receiving a block having a length n where n represents an integer equal to or greater than two of an information bit string divided into said m−1 blocks of bit strings having the length n and a single block of a bit string having a length n−r where r represents an integer from 1 to n, inclusive, performing polynomial multiplication, and respectively outputting a bit series having the length n;
   in an adder unit adding each output of said m−1 polynomial multiplying units; and
   in a polynomial dividing unit performing polynomial division of an output result of said adder unit and said block having the length n−r and outputs a redundant bit series having a length r.

6. The error correction encoding method as defined in claim 5, wherein a wiring polynomial that specifies the wiring connection in said polynomial dividing unit is a minimal polynomial among polynomials defined by a set of elements whose values coincide with each other when raised to the m-th power, and whose traces to a finite field of $2^S$ elements are a value other than zero and coincide with each other in a subset of a finite field of $2^{2S}$ where S represents a positive integer elements, and the quotient polynomial when a polynomial defined by a subset of another finite field is divided by said minimal polynomial is a wiring polynomial that specifies the wiring connection in said polynomial multiplying units.

7. The error correction encoding method as defined in claim 5, wherein wiring polynomials that specify the wiring connection in said polynomial dividing unit are randomly selected, and each of m−1 wiring polynomials that specify the wiring connection in said m−1 polynomial multiplying units are determined by powers of said polynomials selected randomly that are different from each other.

* * * * *